United States Patent
Doi

(10) Patent No.: US 7,723,998 B2
(45) Date of Patent: May 25, 2010

(54) INTEGRATED CIRCUIT PROTECTION AND DETECTION GRID

(75) Inventor: Bryan Cary Doi, Queen Creek, AZ (US)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 584 days.

(21) Appl. No.: 11/811,729

(22) Filed: Jun. 12, 2007

(65) Prior Publication Data

US 2008/0313746 A1 Dec. 18, 2008

(51) Int. Cl.
*H01H 31/02* (2006.01)
*G11B 11/00* (2006.01)
*G06F 12/14* (2006.01)

(52) U.S. Cl. .............. 324/555; 369/53.21; 713/194

(58) Field of Classification Search .......... 324/555, 324/500; 257/635, 922, 686, 679, 678; 340/687; 365/185.04; 713/189, 194; 369/53.21, 275.5
See application file for complete search history.

(56) References Cited

U.S. PATENT DOCUMENTS

| | | | | |
|---|---|---|---|---|
| 4,691,350 A | * | 9/1987 | Kleijne et al. ........... 713/194 |
| 4,807,284 A | * | 2/1989 | Kleijne ................. 713/194 |
| 4,811,288 A | * | 3/1989 | Kleijne et al. ............ 365/52 |
| 5,117,457 A | * | 5/1992 | Comerford et al. ........ 713/194 |
| 5,159,629 A | * | 10/1992 | Double et al. ........... 713/194 |
| 5,389,738 A | | 2/1995 | Piosenka et al. |
| 5,821,582 A | | 10/1998 | Daum |
| 5,998,858 A | * | 12/1999 | Little et al. ............. 257/678 |
| 6,646,565 B1 | * | 11/2003 | Fu et al. ................ 340/687 |
| 7,054,162 B2 | | 5/2006 | Benson et al. ........... 361/760 |
| 7,376,073 B2 | * | 5/2008 | Hart et al. ........... 369/275.5 |
| 7,643,393 B2 | * | 1/2010 | Hart et al. ........... 369/53.21 |
| 2006/0087883 A1 | * | 4/2006 | Ozguz et al. ......... 365/185.04 |
| 2007/0018334 A1 | | 1/2007 | Peytavy et al. |
| 2008/0251905 A1 | * | 10/2008 | Pope et al. ............. 257/679 |
| 2008/0251906 A1 | * | 10/2008 | Eaton et al. ........... 257/686 |

FOREIGN PATENT DOCUMENTS

FR 2 888 975 A 1/2007
WO WO 2004/038800 A 5/2004

* cited by examiner

*Primary Examiner*—Hoai-An D Nguyen
(74) *Attorney, Agent, or Firm*—Davidson Berquist Jackson & Gowdey LLP

(57) ABSTRACT

A mesh of conductors forms a grid in a multi-layered electronic device. The mesh of conductors includes (1) a first set of conductors disposed in one layer forming parallel lines in the one layer, and (2) a second set of conductors disposed in another layer forming parallel lines in the other layer. The first set of conductors is configured to provide a first voltage reference, and the second set of conductors is configured to provide a second voltage reference. At least one grid check circuit is coupled to the first set of conductors and the second set of conductors for monitoring presence and/or absence of the first or second voltage references. The parallel lines formed in the one layer and the parallel lines formed in the other layer are substantially perpendicular to each other.

20 Claims, 12 Drawing Sheets

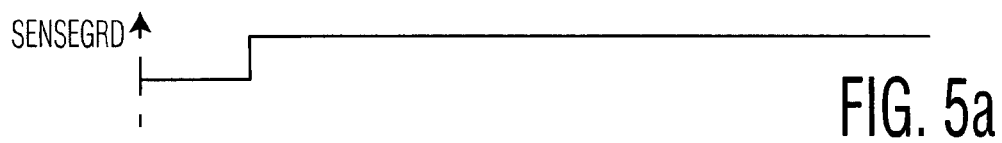
FIG. 5a
FIG. 5b
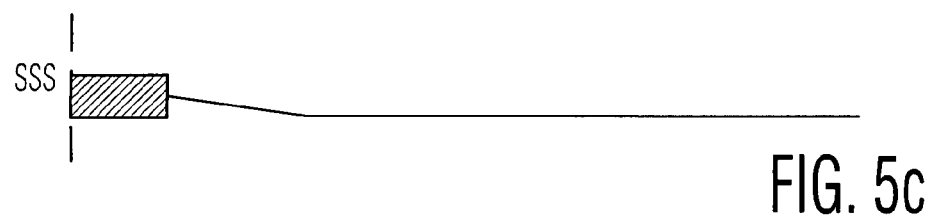
FIG. 5c
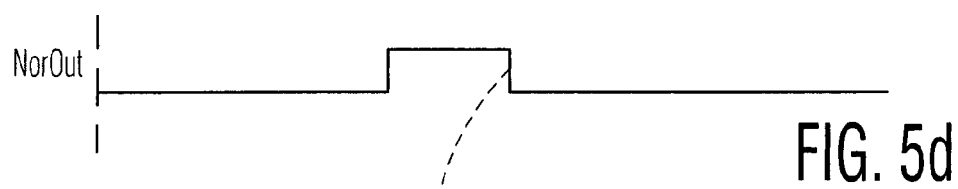
FIG. 5d
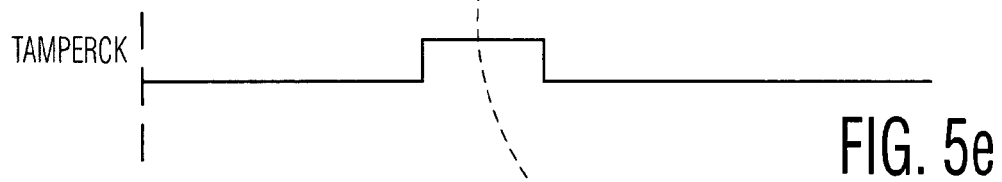
FIG. 5e
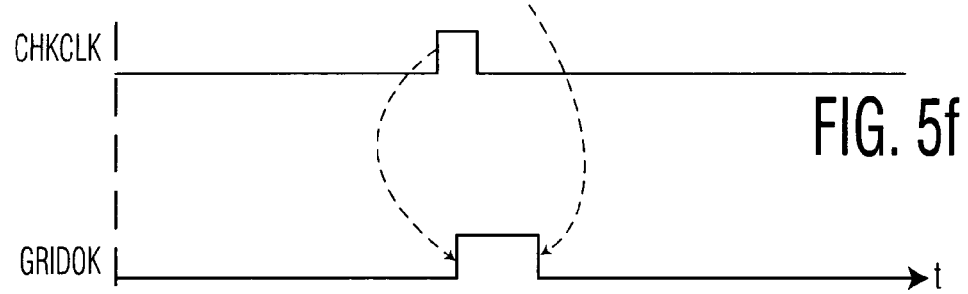
FIG. 5f
FIG. 5g

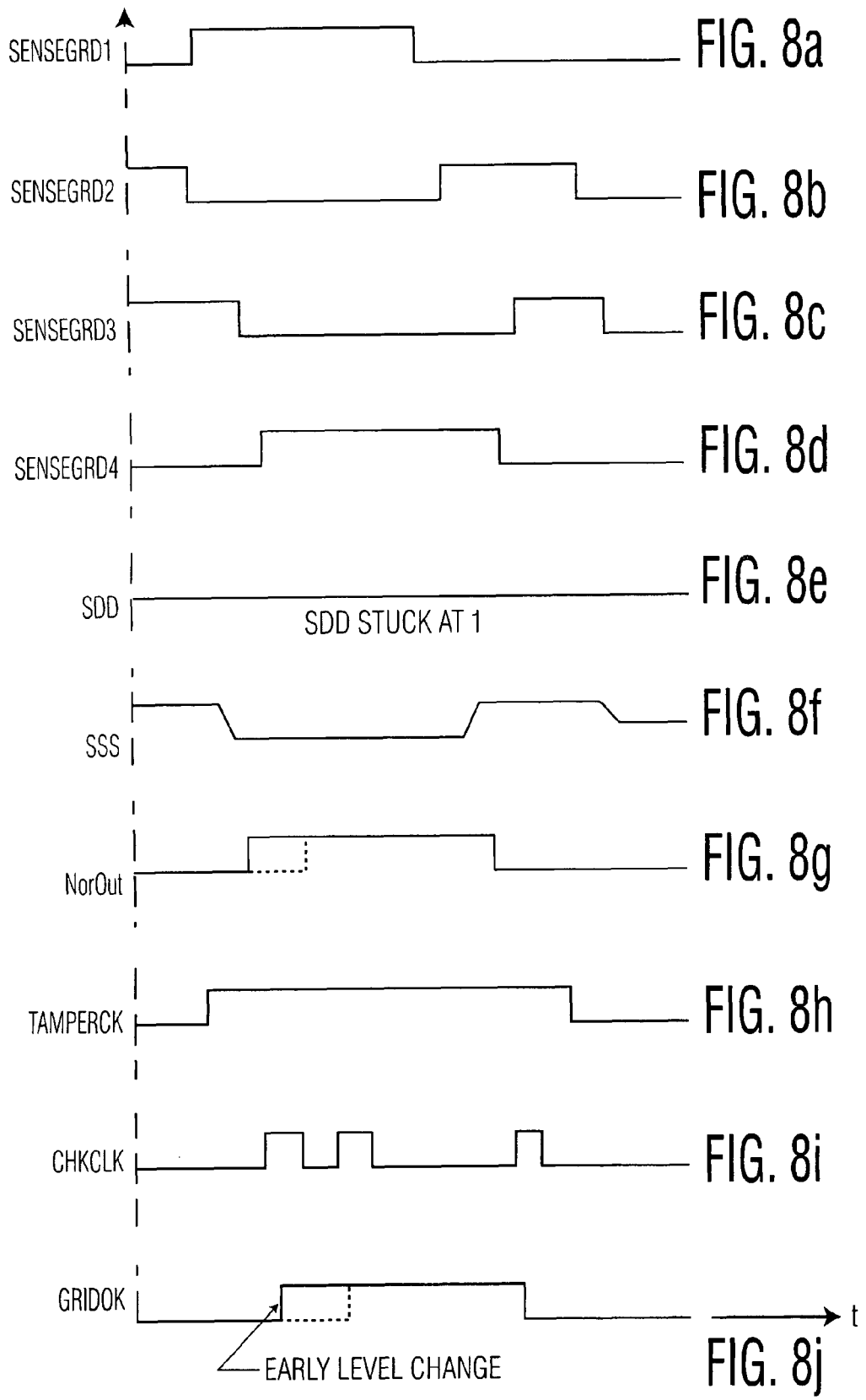

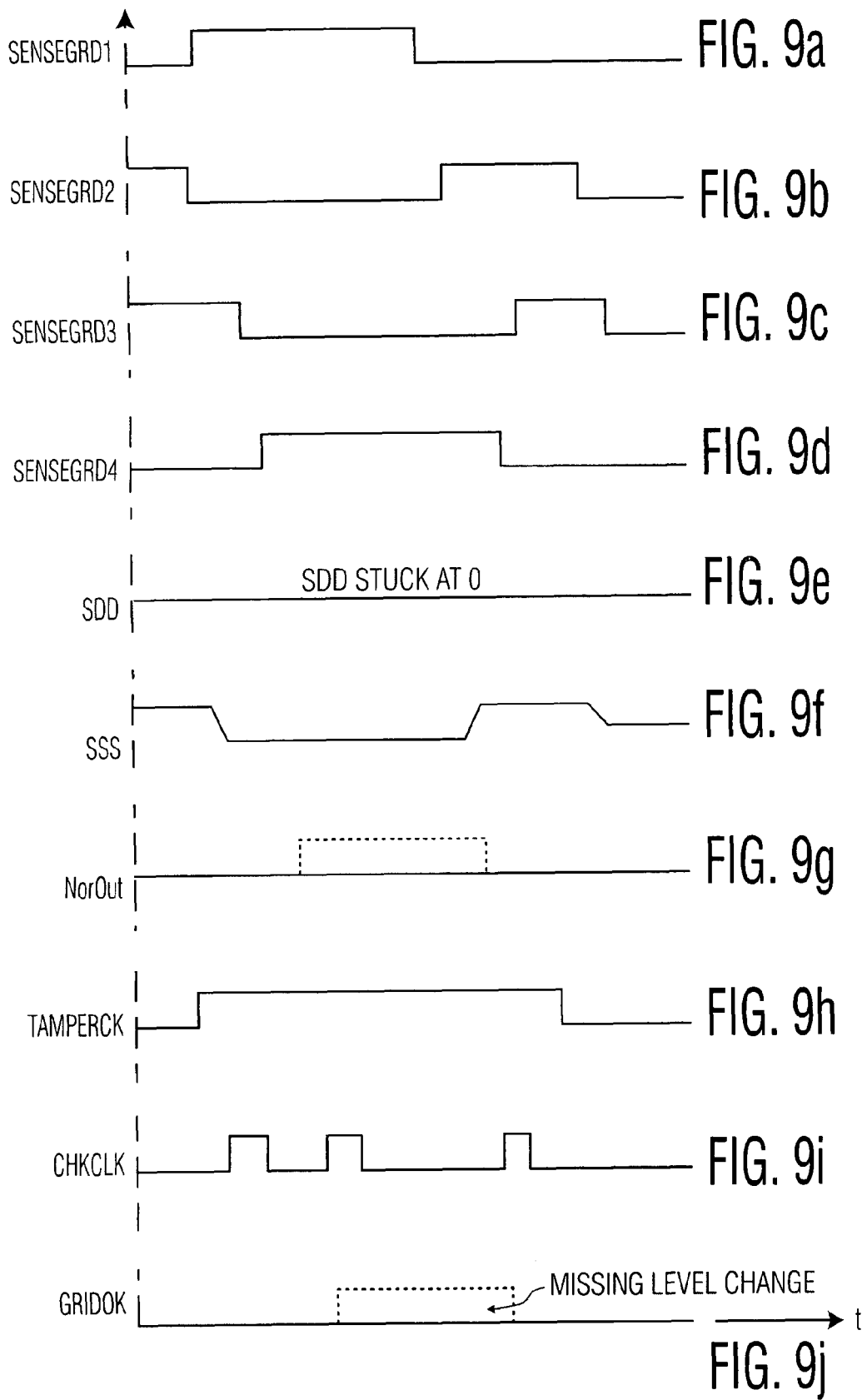

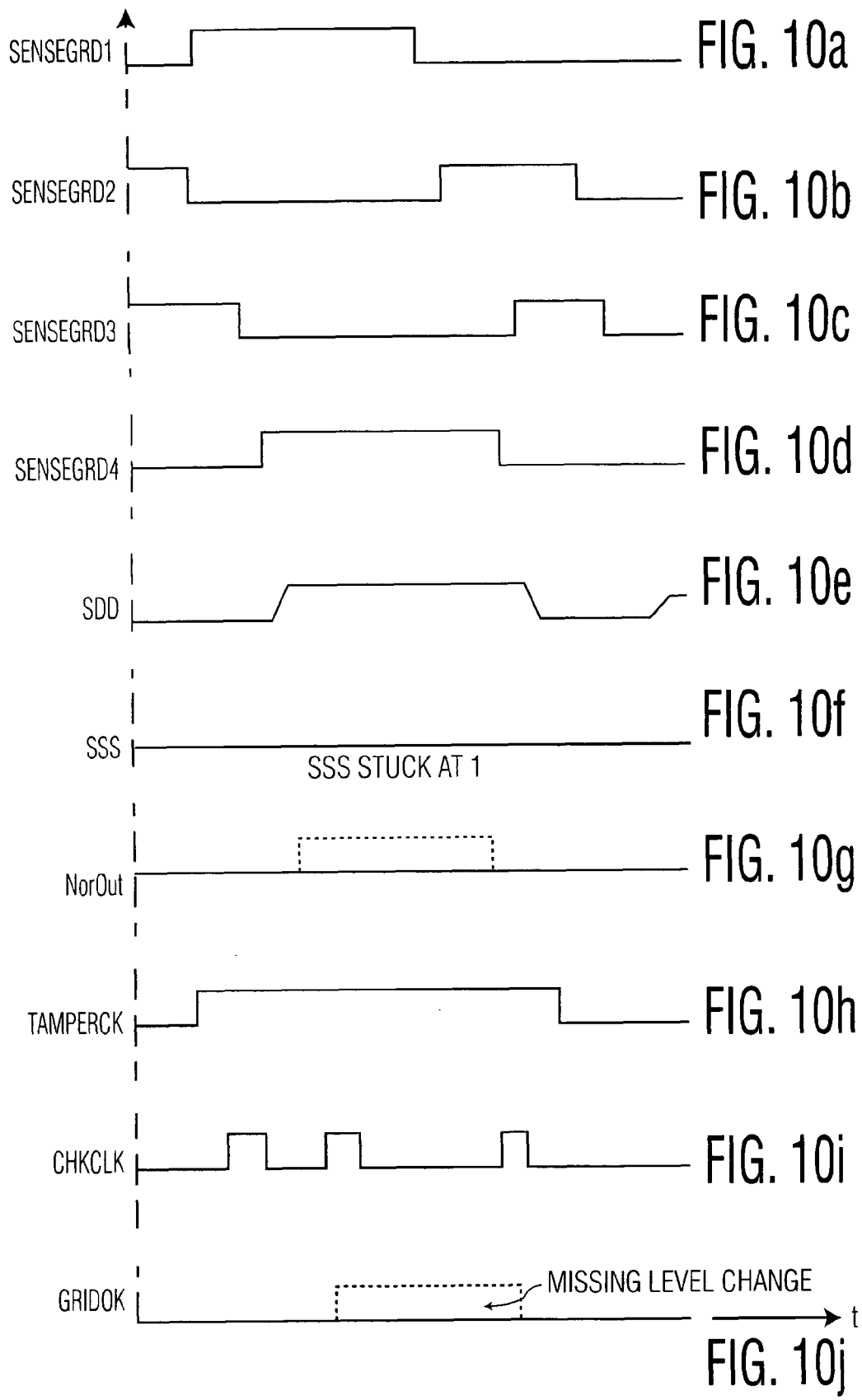

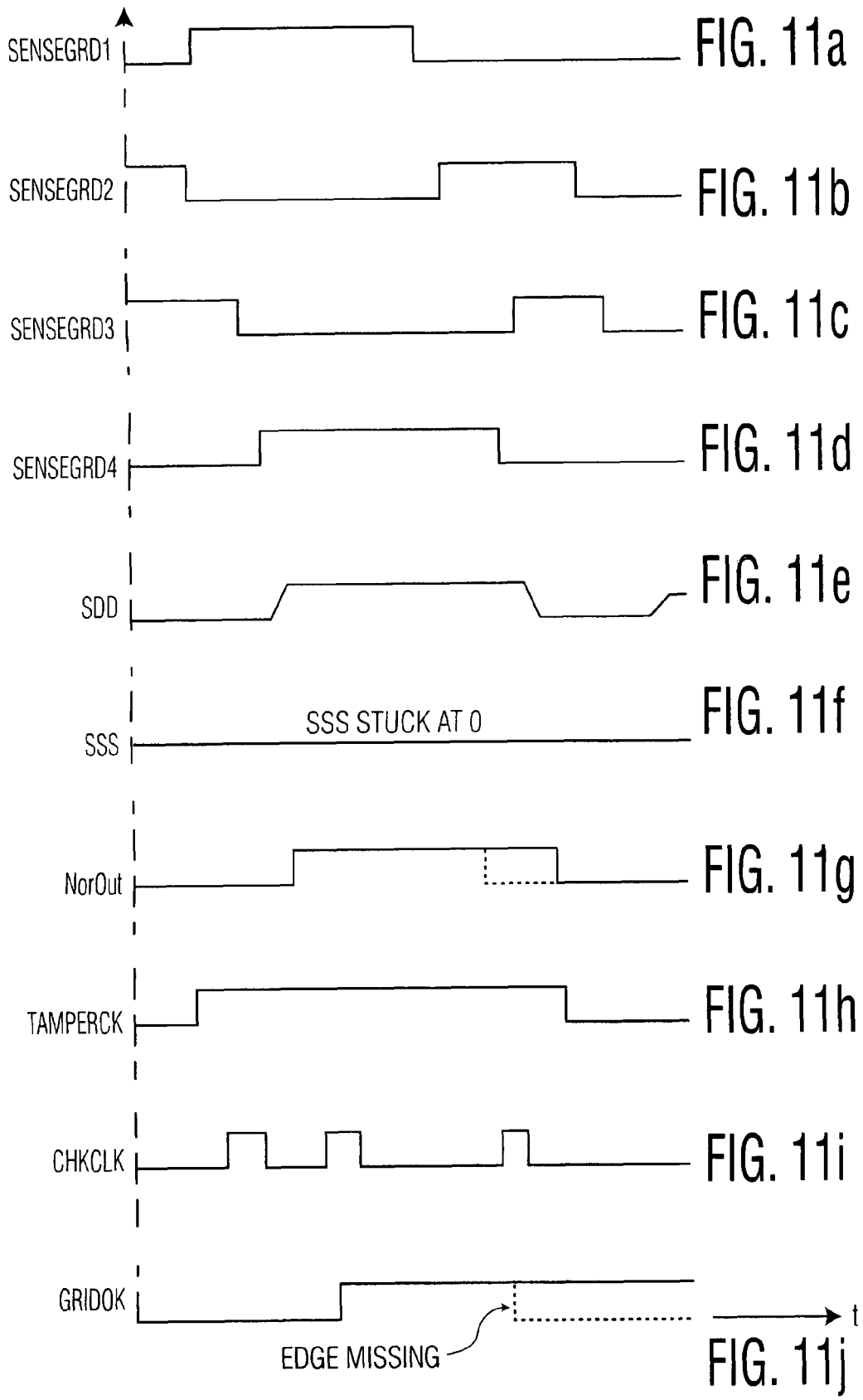

INTEGRATED CIRCUIT PROTECTION AND DETECTION GRID

FIELD OF THE INVENTION

The present invention relates, in general, to protecting an integrated circuit from unauthorized access by users. More specifically, the present invention relates to embedding a physical mesh into a die surface to deter unauthorized access, where the physical mesh provides active, self checking of an attack to the die surface.

BACKGROUND OF THE INVENTION

Protection of a die surface from access by unauthorized personnel has been in the past limited to various assembly techniques that make access to the surface of the die difficult. Die coatings that obscure the surface of the die have been used in the past to both hide and protect the surface from attack. There have been some attempts to embed a physical mesh into the coating to deter access, but this mesh is neither active nor self checking.

Die coating and assembly techniques along with an applied static mesh are passive deterrents to attackers, who are trying to reverse engineer, or gain information from devices. While each technique has advantages, one disadvantage is that there is no capability to detect an attack and have the device react to that attack during chip operation. The static nature of the protection allows attackers to attempt to compromise the device security during operation and gain information.

Attackers with access to ion-milling/e-beam equipment are able to etch/grind down through protective coatings, re-stitch damaged bonds and then ion-mill (drill) into the surface of the device and e-beam probe signals within the device. Detection of the physical intrusion into the die surface requires deterring and detecting this form of attack.

Ion-milling is capable of drilling into the surface of the insulating layers to access wires running below the surface. By depositing metal, it is possible to bring buried signals running on these wires to the surface of the die. These signals may be measured with an e-beam probe or may be connected to some other signal on the die.

As will be explained, the present invention advantageously embeds a physical mesh into a die surface during the manufacturing process to deter unauthorized access. In addition, the physical mesh provides active, self checking of an attack to the die surface.

SUMMARY OF THE INVENTION

To meet this and other needs, and in view of its purposes, the present invention provides a protection circuit for integrity monitoring of an electronic device. The protection circuit includes (1) a first grid check line interleaved between a first set of conductor lines, each distributing a first potential reference to the electronic device, (2) a second grid check line interleaved between a second set of conductor lines, each distributing a second potential reference to the electronic device, and (3) a grid check circuit coupled to the first and second grid check lines. The first and second grid check lines are configured to provide first and second voltage references, respectively, to the grid check circuit for monitoring the integrity of the electronic device.

The first and second potential references are VDD and VSS, respectively. The first and second voltage references are SSS and SDD, respectively. The VDD potential reference is substantially similar to the SDD voltage reference, and the VSS potential reference is substantially similar to the SSS voltage reference.

The electronic device is a multi-layered device. The first grid check line and the first set of conductor lines are disposed in one single layer of the multi-layered device, and the second grid check line and the second set of conductor lines are disposed in another single layer of the multi-layered device. The first and second sets of conductor lines, respectively, are embedded in adjacent metallization layers for forming a power distribution grid in the electronic device. The first and second grid check lines, respectively, are embedded in the same adjacent metallization layers for forming a voltage difference in the grid check circuit.

The first set of conductor lines are connected to each other and are longitudinally distributed in one metallization layer. The second set of conductors lines are connected to each other and are transversely distributed in another metallization layer. The first grid check line includes a plurality of first grid check lines connected to each other and longitudinally distributed in the one metallization layer, and the second grid check line includes a plurality of second grid check lines connected to each other and transversely distributed in the other metallization layer.

Another embodiment of the invention is a mesh of conductors forming a grid in a multi-layered electronic device. The mesh includes a first set of conductors disposed in one layer forming parallel lines in the one layer, and a second set of conductors disposed in another layer forming parallel lines in the other layer. The first set of conductors is configured to provide a first voltage reference, and the second set of conductors is configured to provide a second voltage reference. At least one grid check circuit is coupled to the first set of conductors and the second set of conductors for monitoring presence and/or absence of at least one of the first or second voltage references. The parallel lines in the one layer and the parallel lines in the other layer are substantially perpendicular to each other.

The multi-layered electronic device includes a first set of power lines and a second set of power lines for providing a potential difference to the electronic device. The first and second set of power lines are different from the first and second set of conductors. The first set of power lines provides a positive voltage reference to the electronic device, and the first set of conductors provides a ground voltage reference. The first set of power lines is interleaved with the first set of conductors in the one layer. The second set of power lines provides a ground voltage reference to the electronic device, and the second set of conductors provides a positive voltage reference. The second set of power lines is interleaved with the second set of conductors in the other layer.

Yet another embodiment of the present invention is a method for integrity monitoring of a multi-layered electronic device. The method includes the steps of: (a) distributing a first potential reference by way of one metallization layer of the electronic device; (b) distributing a second potential reference by way of another metallization layer of the electronic device; (c) distributing a first voltage reference, which is different from the first potential reference in the one metallization layer; (d) distributing a second voltage reference, which is different from the second potential reference in the other metallization layer; and (e) periodically monitoring the distribution of the first and second voltage references to determine the integrity of the multi-layered electronic device.

It is understood that the foregoing general description and the following detailed description are exemplary, but are not restrictive, of the invention.

BRIEF DESCRIPTION OF THE FIGURES

The invention is best understood from the following detailed description when read in connection with the accompanying figures:

FIGS. 5a-5g are timing diagrams showing timing relationships among the signals of the grid check circuit of FIG. 4, in accordance with an embodiment of the present invention.

FIGS. 8a-8j are timing diagrams showing timing relationships among various signals of the grid check circuit of FIG. 6, when the SDD signal is stuck at a 1-level.

FIGS. 9a-9j are timing diagrams showing timing relationships among various signals of the grid check circuit of FIG. 6, when the SDD signal is stuck at a 0-level.

FIGS. 10a-10j are timing diagrams showing timing relationships among various signals of the grid check circuit of FIG. 6, when the SSS signal is stuck at a 1-level.

FIGS. 11a-11j are timing diagrams showing timing relationships among various signals of the grid check circuit of FIG. 6, when the SSS signal is stuck at a 0-level.

DETAILED DESCRIPTION OF THE INVENTION

The present invention utilizes, as an example, the top two layers of metal of an integrated circuit. Most high performance sub-micron processes utilize 7-8 layers of metal and the top two layers are typically used for power distribution, clock distribution and assembly. As will be explained, the present invention mixes within the top two layers of metal, a grid check line that runs parallel in each layer to the power grid. The grid check lines are configured to be stimulated and sensed by grid check circuits located at various places around the die, preferably shielded by overlaying metal layers. As will also be explained, the grid check circuits are configured to both stimulate the grid check lines as well as sense them. This allows the grid to be verified from multiple locations around the die with an active send/receive capability.

Figure 1:
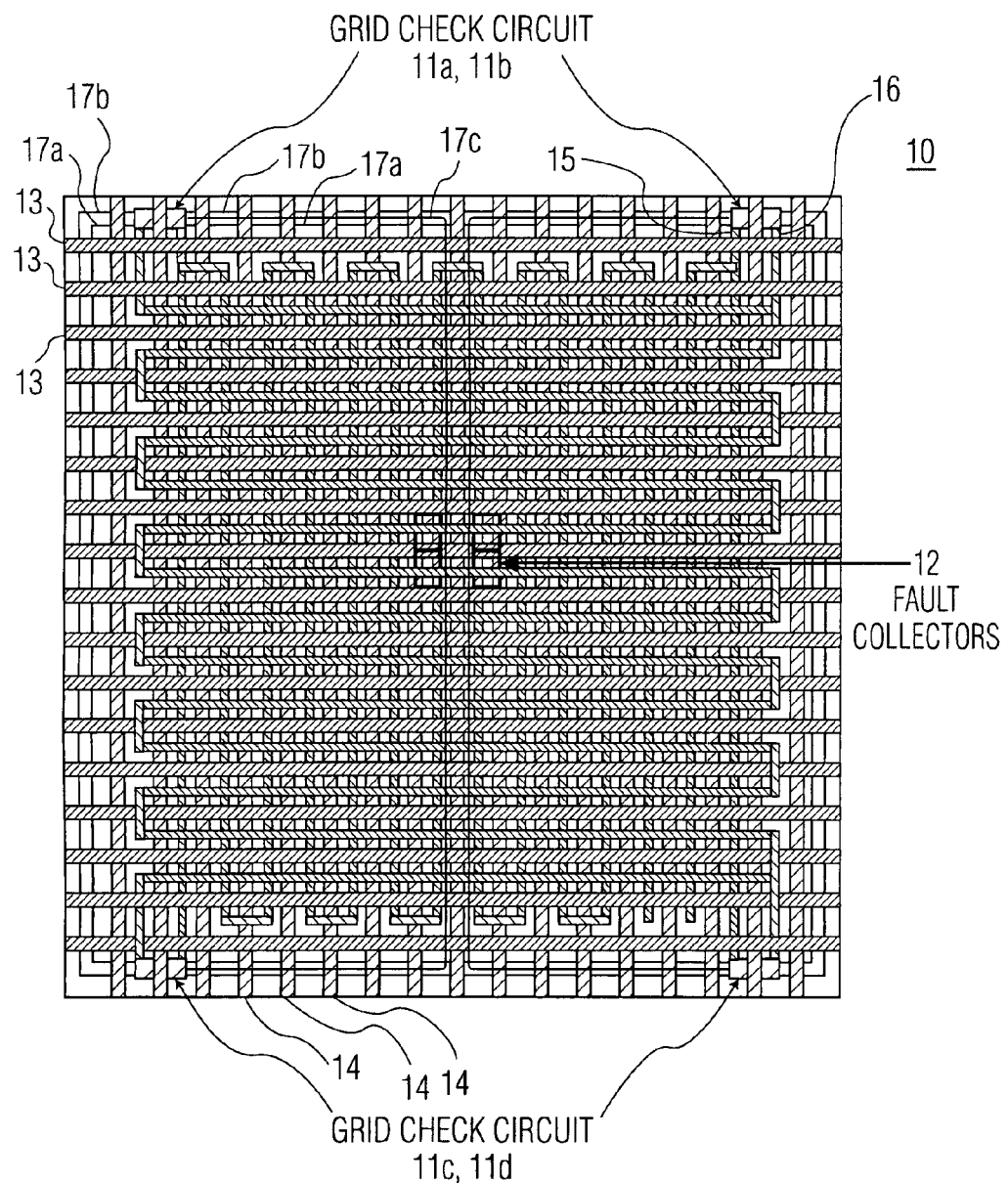
FIG. 1 is a multi-layered device which includes a mesh of conductor lines feeding gird check circuits for monitoring the integrity of the multi-layered device, in accordance with an embodiment of the present invention.

Referring now to FIG. 1, there is shown a multi-layered device, generally designated as 10. As shown, multi-layered device 10 includes four grid check circuits, designated as 11a, 11b, 11c and 11d. The grid check circuits may be placed in multiple locations on the device. There may be more than four, or less than four grid check circuits on multi-layered device 10, and they may be in locations other than the corner locations, shown in FIG. 1.

Fault collectors, generally designated as 12, are placed on the device to collect results of tests performed periodically by each respective grid check circuit. As shown in FIG. 1, four fault collectors 12 are located in the center area of multi-layered device 10.

Figure 2A:
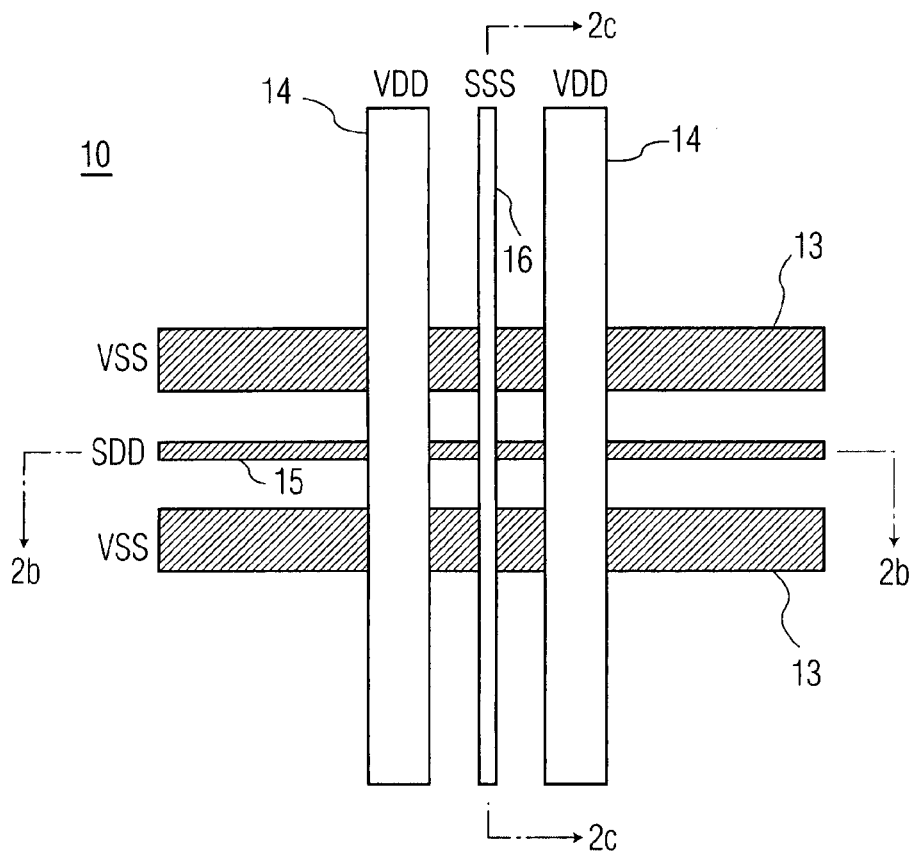
FIGS. 2a, 2b and 2c are expanded views of the conductor lines interleaved with the power distribution lines of the multi-layered device of FIG. 1, in accordance with an embodiment of the present invention.
Figure 2B:
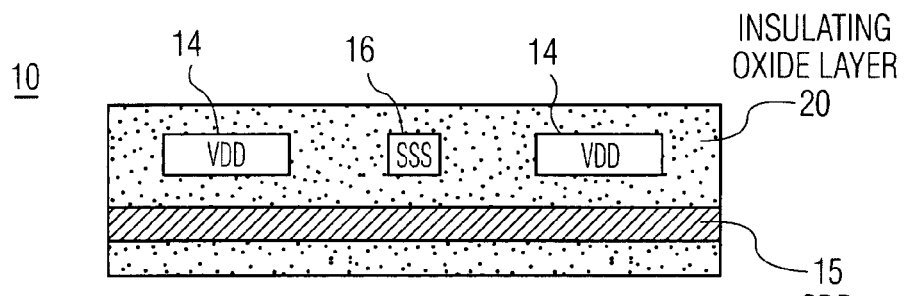
Figure 2C:
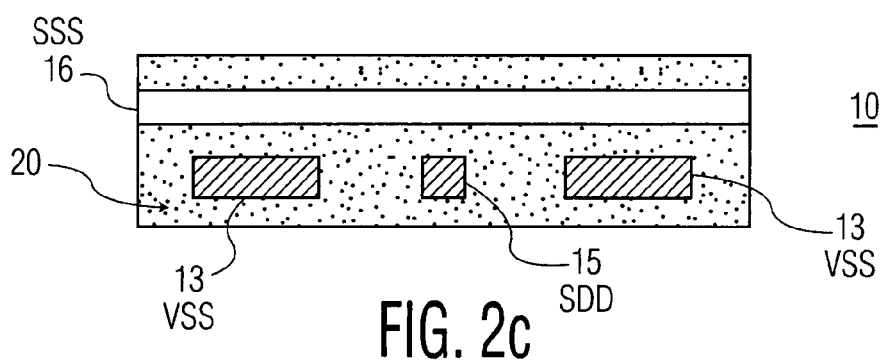

A conventional power distribution grid, typically in the top two layers of metal, includes a VDD potential reference distributed by VDD conductor lines 14 and a VSS potential reference (usually ground reference) distributed by VSS conductor lines 13. In the exemplary embodiment, VDD conductor lines 14 and VSS conductor lines 13 are oriented orthogonally with respect to each other. In addition, as best shown in FIGS. 2a, 2b and 2c, the VDD conductor lines are disposed in insulating oxide layer 20 (shown in FIGS. 2b and 2c), where VDD conductor lines 14 are a metal layer above VSS conductor lines 13.

Interleaved between VDD conductor lines 14 are grid check lines SSS 16 and interleaved between VSS conductor lines 13 are grid check lines SDD 15. As best shown in FIGS. 2a, 2b and 2c, grid check lines SSS 16 are disposed in the same metal layer as VDD conductor lines 14. Similarly, grid check lines SDD 15 are disposed in the same metal layer as VSS conductor lines 13. In this manner, grid check lines SSS 16 and SDD 15 are oriented orthogonally to each other, and are disposed in two adjacent metal layers, one above the other.

As shown in FIG. 1, and described in detail later, grid check lines SSS 16 and SDD 15 provide two separate voltage references into each grid check circuit 11a, 11b, 11c and 11d.

Completing the description of FIG. 1, there is shown, by way of example, thin conductor lines 17a, 17b and 17c. Conductor lines 17a and 17b provide two respective input control signals into each grid check circuit 11a, 11b, 11c and 11d. Conductor line 17c provides an output control signal from each grid check circuit 11a, 11b, 11c and 11d. It will be understood that only two input control signals and one output control signal are shown in FIG. 1 for the sake of clarity. As will be explained later, more than two input control signals may be provided to each grid check circuit. Finally, each output control signal placed on conductor lines 17c is routed to a fault collector residing in fault collectors 12, residing, by way of example, at the center of multi-layered device 10.

As shown in FIGS. 2b and 2c, grid check lines SSS 16 and SDD 15, as well as VSS conductor lines 13 and VDD conductor lines 14, are each electrically insulated from each other by an insulating oxide layer, generally designated as 20.

Figure 3A:
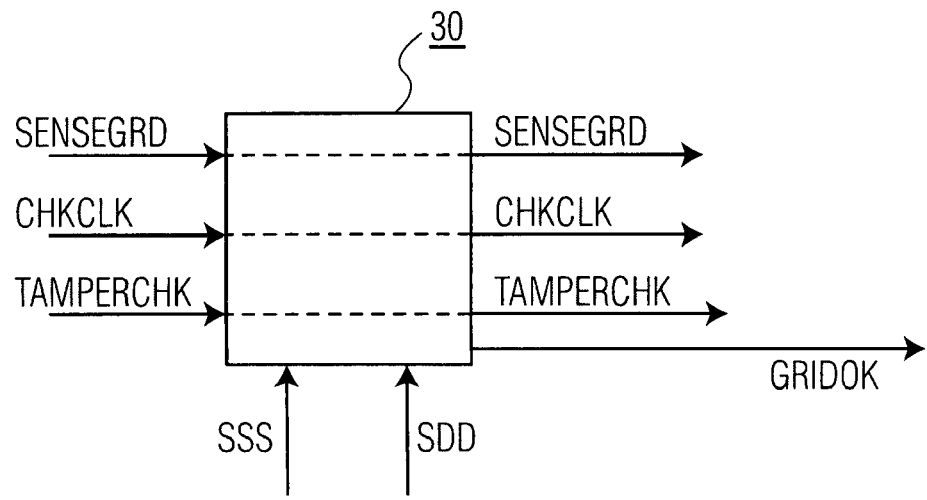
FIGS. 3a and 3b are exemplary embodiments of grid check circuits.
Figure 3B:
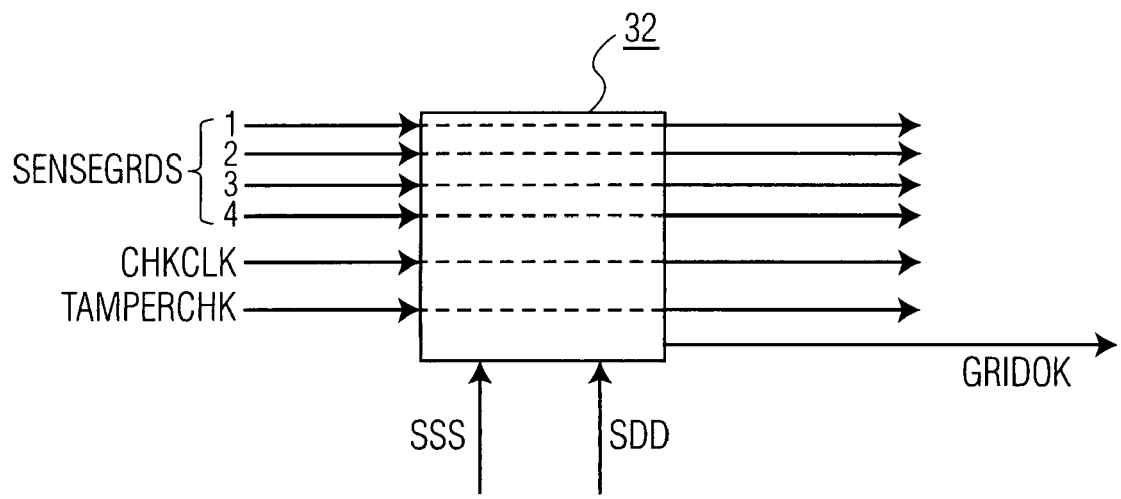

Referring next to FIGS. 3a and 3b, there are shown two exemplary embodiments of grid check circuits, generally designated as 30 and 32, respectively. Grid check circuit 30 includes three input control signals, namely, sensegrid, checkclock and tampercheck. Since grid check circuits 11a, 11b, 11c and 11d (FIG. 1, for example) receive the same input control signals, the grid check circuit shown in FIG. 3a functionally illustrates the same three input signals continuing on toward the next grid check circuit on multi-layered device 10 (This is shown by dashed lines in FIG. 3a).

Also shown in FIG. 3a are the grid check lines associated with each layer, namely grid check lines SDD and SSS, which are provided as a + logic "1" voltage reference and a logic "0" voltage reference, respectively. If grid check circuit 30 determines that the integrity of two grid check lines SDD and SSS have not been tampered with (as explained later), then grid check circuit 30 provides the gridok signal to fault collectors 12 (for example).

The grid check circuit 32, which is similar to grid check circuit 30, is shown in FIG. 3b. As will be explained later, grid check circuit 32 provides a more comprehensive grid power check than the power check provided by grid check circuit 30. This is done by providing four different sensegrid signals, designated as sensegrids 1, 2, 3 and 4. Accordingly, grid check circuit 32 includes six input control lines, as shown in FIG. 3b, compared to grid check circuit 30, which only has three input control lines. Both exemplary circuits include grid check lines SDD and SSS as power input signals. Both exemplary circuits also include the gridok signal, which provides a status output to the fault collectors based on the integrity checks conducted by the grid check circuits.

Figure 3C:
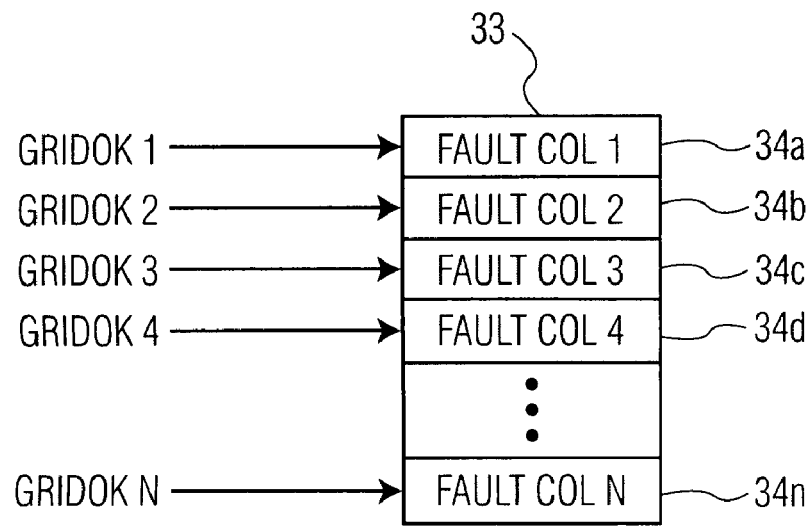
FIG. 3c is an exemplary embodiment of a fault collector module for collecting status outputs from the grid check circuits.

Referring next to FIG. 3c, there is shown the fault collectors, generally designated as 33. As shown, fault collectors 33 include N fault collector modules 34a, 34b, ..., and 34n. There are preferably two fault collector modules for every grid check circuit provided on multi-layered device 10 (FIG. 1, for example, shows four grid check circuits 11a, 11b, 11c and 11d). There are, therefore, N-gridok input signals corresponding to the N-grid check circuits provided to the N-fault collector modules 34a-n. Although FIG. 3c depicts N separate fault collector modules, it will be appreciated that one single module may be configured to collect the status output signals provided from each grid check circuit on multi-layered device 10.

Figure 3D:
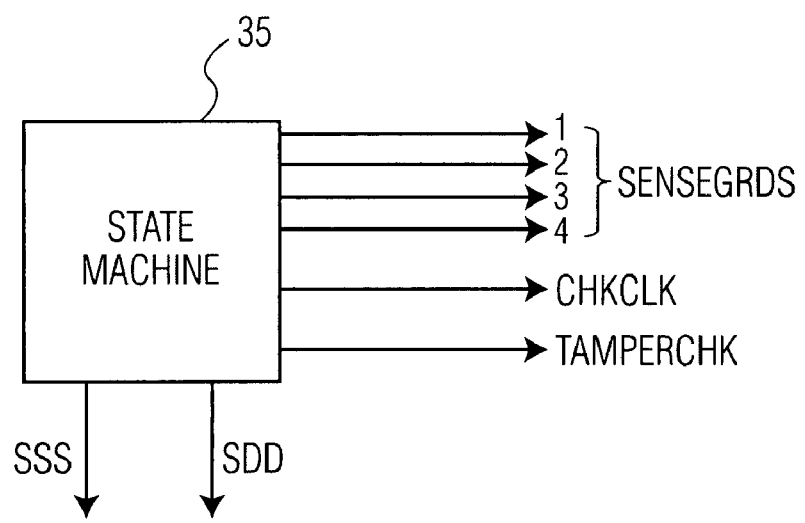
FIG. 3d is an exemplary embodiment of a state machine for controlling the grid check circuits.

FIG. 3d depicts an exemplary state machine, designated as 35, for providing the input control signals (sensegrid 1-4, checkclock and tampercheck) to each grid check circuit on the multi-layered device. As shown, state machine 35 also provides the +logic "1" voltage reference and the logic "0" voltage reference to grid check lines SDD and SSS, which, in turn, are sent to each grid check circuit.

Figure 4:
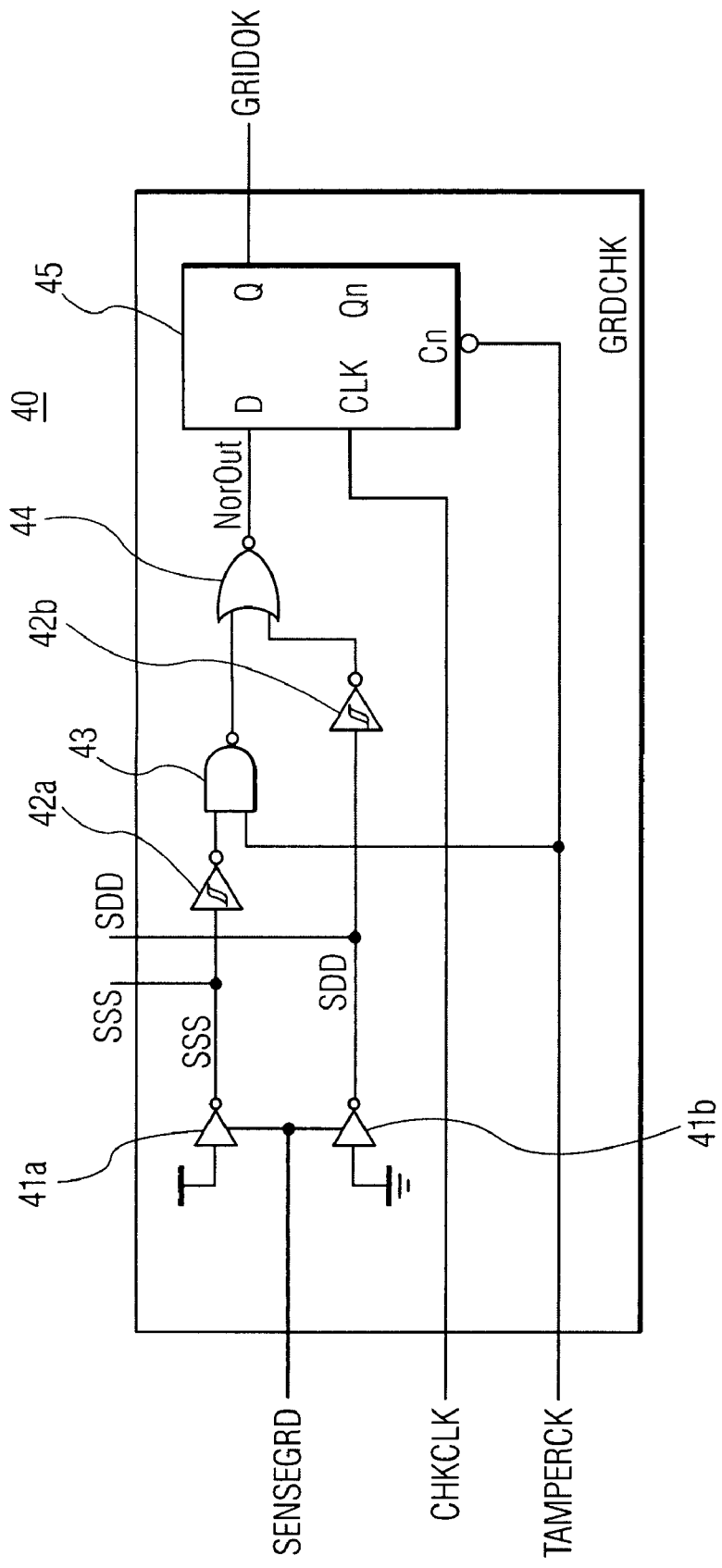
FIG. 4 is a schematic diagram of a grid check circuit, in accordance with an embodiment of the present invention.
Figure 6:
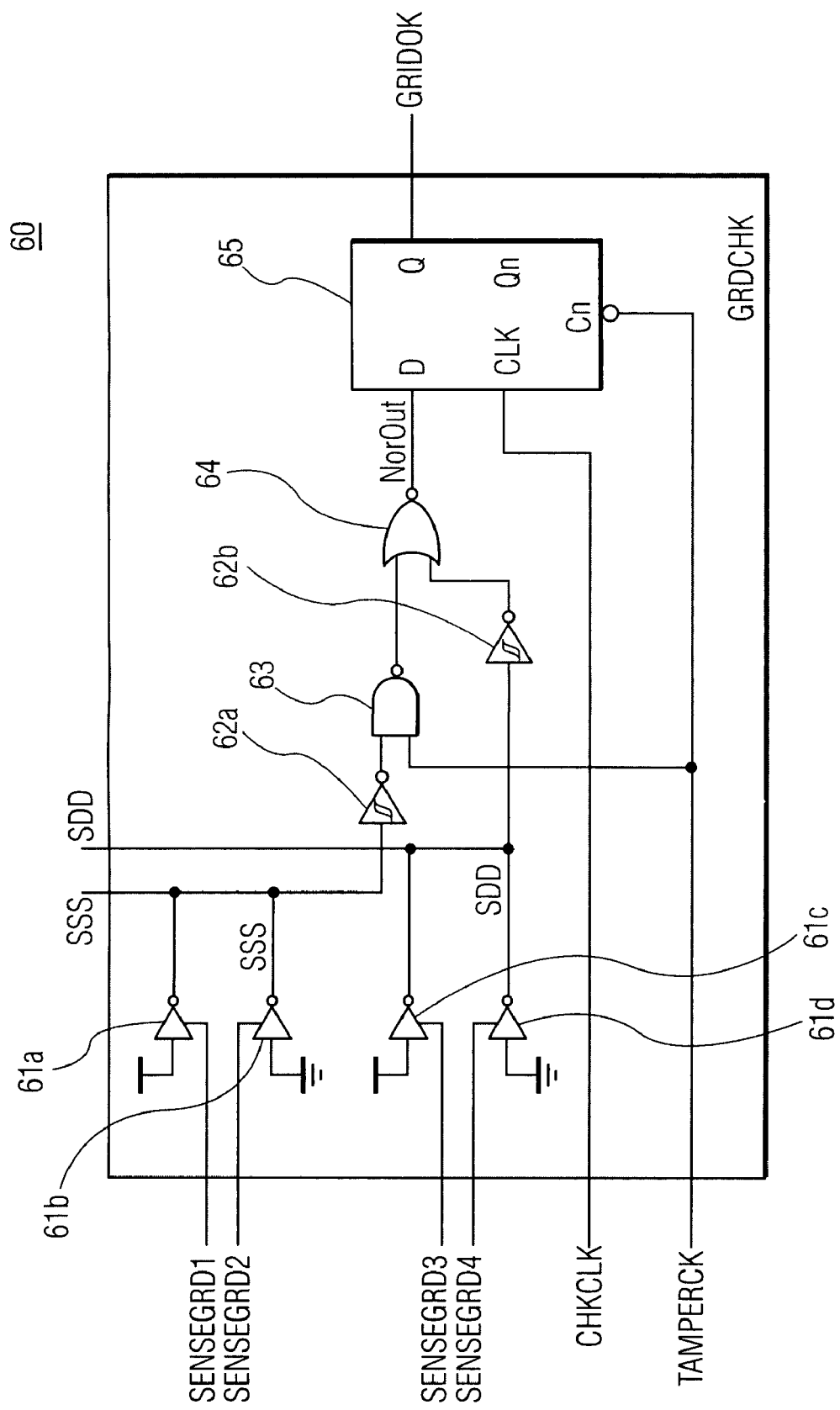
FIG. 6 is a grid check circuit, in accordance with another embodiment of the present invention.

The present invention may include different types of grid check circuits. Exemplary grid check circuits are shown in FIGS. 4 and 6. The operation of these circuits will now be explained.

Referring first to FIG. 4, grid check circuit 40 includes two grid check lines SDD and SSS. The SDD and SSS lines are controlled by the signal sensegrid, which enables two tristate drivers 41a and 41b to drive SDD high and SSS low. The capacitive loads on the SDD and SSS lines are very high and, consequently, the transition times of the SDD and SSS reference voltages are long. This is shown in the timing diagram of FIGS. 5a-5c.

Receive inverters 42a and 42b are Schmitt triggers for avoiding any possibility of crow-bar current causing a high current condition during the transitions of the SDD and SSS reference voltages. Once stabilized, the input to flip-flop 45, namely NorOut, is controlled by the tampercheck signal, as shown in FIGS. 5d and 5e.

The tampercheck signal also enables NAND gate 43. If SDD is a 1-reference and SSS is a 0-reference, then NOR gate 44 provides a 1-reference as an output signal, indicating that the SSS and SDD reference signals are in their correct states. The timing is shown in FIGS. 5d and 5e.

The checkclock signal is used to latch the value of NorOut, inputted into the D-terminal of D-flip-flop (DFF) 45. The output of the DFF, namely the gridok signal, is sent to the fault collectors (FIG. 3c). The DFF 45 clears itself, following the disable of the tampercheck signal, as shown in the timing diagrams of FIGS. 5f and 5g. The gridok signal returns to a 0-reference, following the transition of NorOut (FIG. 5d).

Completing the description of the operation of grid check circuit 40, the shaded portions of FIGS. 5b and 5c represent the SSS and SDD reference signals in a floating state, due to tristate drivers 41a and 41b being in non-active states, prior to the sensegrid signal transitioning to a 1-level (FIGS. 5a-5c). The transition times of the SSS and SDD reference signals may be as long as 100-200 nsec.

Accordingly, the architecture of the grid check lines SDD and SSS running throughout the surface of the chip (or circuit board) and interleaved with conductor lines VSS and VDD, respectively, allows the integrity of the grid (or mesh) to be actively checked under circuit control by the present invention. If the device (10, for example) is powered-down and ion-milled, the likelihood of cutting or shorting one of the grid check lines is fairly high. In addition, the ability of independently activating the sensegrid control signals allows checks (or verifications) to be executed across the chip/die with one test circuit (for example, state machine 35 of FIG. 3d) generating a test sequence, while the remaining circuits (for example, grid check circuits 11a, 11b, 11c and 11d of FIG. 1) examine the SSS and SDD reference lines to verify that they have the correct polarities.

An added benefit of assigning the correct polarities to the SSS and SDD reference potentials is that during any ion-milling operation and metal deposition operation, sputtering across the surface and ion-milling is not specific. Consequently, the likelihood is high that during the metal deposition operation, a voltage short may be created between either the SSS or SDD lines and the corresponding adjacent power supply lines VDD or VSS. By correctly choosing the SSS and SDD reference potentials, the present invention is effective in detecting a voltage short to an adjacent power supply line.

A more comprehensive grid check circuit is exemplified by FIG. 6. The grid check circuit 60 is capable of separately checking for both high and low polarities on the SSS and SDD grid check lines. By checking for both high and low polarities, a higher level of confidence may be achieved that a grid check line is not stuck at a high or a low reference potential.

Referring now to FIG. 6, grid check circuit 60 includes four separate tristate drivers 61a, 61b, 61c and 61d. These tristate drivers are controlled by one of sensegrid 1, sensegrid 2, sensegrid 3 and sensegrid 4 control signals. The ability to float the SSS and SDD grid check lines allows for point-to-point testing, similarly to the testing conducted by the circuit shown in FIG. 4.

Similar to the elements shown in FIG. 4, inverters 62a and 62b are Schmitt triggers, enabling the SSS reference as an input signal to NAND gate 63 and the SDD reference as an input to NOR gate 64, respectively. The NorOut signal is provided by NOR gate 64 to DFF 65.

The operation of grid check circuit 60 is explained by reference to FIGS. 7a-7j. The activation of tristate drivers 61a, 61b, 61c and 61d is executed during the 1-level of sensegrid 1, sensegrid 2, sensegrid 3 and sensegrid 4, respectively, shown in FIGS. 7a, 7b, 7c and 7d. It will be understood that sensegrid 1 and sensegrid 2 may not occupy a 1-level (ON-state) during the same time. A similar restriction is that sensegrid 3 and sensegrid 4 may not occupy a 1-level (ON-state) at the same time.

Figure 7A:
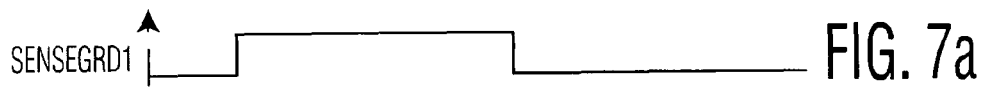
FIGS. 7a-7j are timing diagrams showing timing relationships among signals of the grid check circuit of FIG. 6, when the signals are valid, in accordance with an embodiment of the present invention.
Figure 7B:
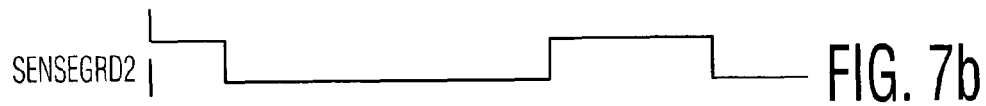
Figure 7C:
Figure 7D:
Figure 7E:
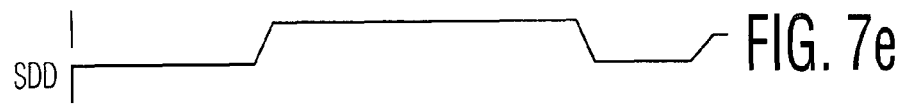
Figure 7F:

The SDD reference signal is first placed into a 0-level, next into a 1-level, and then into a 0-level, as shown in FIG. 7e. Recall that sensegrid 3 and sensegrid 4 activate the SDD reference signal, as shown in FIGS. 7c, 7d and 7e. In a similar manner, the SSS reference signal is first placed into a 1-level, next into a 0-level, and then into a 1-level, as shown in FIG. 7f. Recall that sensegrid 1 and sensegrid 2 activate the SSS reference signal, as shown in FIGS. 7a, 7b and 7f.

Figure 7G:
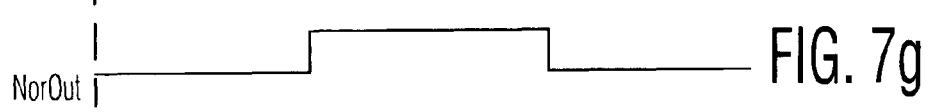

When both the SDD signal is at the 1-level and the SSS signal is at the 0-level, NOR gate 64 provides a 1-level output of the NorOut signal, timed as shown in FIGS. 7e, 7f and 7g.

Figure 7H:
Figure 7I:

The tampercheck and checkclock control signals are shown in FIGS. 7h and 7i, respectively. The tampercheck signal enables NAND gate 63 and DFF 65. During the ON-state of the tampercheck signal, the DFF is clocked by three pulses, as shown in FIG. 7i. The first pulse verifies that the NorOut signal is in the OFF-state (0-level). The second pulse verifies that the NorOut signal is in the ON-state (1-level). The third pulse verifies that the NorOut signal has transitioned back to the OFF-state.

Figure 7J:

If the timing relationship between the NorOut signal and the checkclock signal is correct, as shown in FIGS. 7g and 7i, then a successful (no error) gridok signal, having an ON-state as shown in FIG. 7j is provided to the fault collectors.

Referring next to FIGS. 8a-8j, FIGS. 9a-9j, FIGS. 10a-10j and FIGS. 11a-11j, there are shown waveforms that are generated by grid check circuit 60 of FIG. 6 for various error conditions. It will be appreciated that the timing relationships shown in FIGS. 8, 9, 10 and 11 are similar to the timing relationships shown in FIG. 7. Differences, however, occur in (1) FIG. 8e, where the SDD reference signal is stuck at a 1-level; (2) FIG. 9e, where the SDD reference signal is stuck at a 0-level; (3) FIG. 10f, where the SSS reference signal is stuck at a 1-level; and (4) FIG. 11f, where the SSS reference signal is stuck at a 0-level.

In FIG. 8e, the SDD reference signal is stuck at a 1-level. Consequently, NorOut transitions earlier, as shown in FIG. 8g. In addition, the gridok signal has an earlier transition, as shown in FIG. 8j. The SDD reference signal stuck at a 1-level is thus detectable by the fault collectors.

In FIG. 9e, the SDD reference is stuck at a 0-level. Consequently, NorOut does not transition at all, as shown in FIG. 9g. In addition, the gridok signal does not transition at all, as shown in FIG. 9j. The SDD reference signal stuck at a 0-level is thus detectable by the fault collectors.

In FIG. 10f, the SSS reference signal is stuck at a 1-level. Consequently, NorOut does not transition at all, as shown in FIG. 10g. In addition, the gridok signal does not transition at all, as shown in FIG. 10j. The SSS reference signal stuck at a 1-level is thus detectable by the fault collectors.

In FIG. 11f, the SSS reference is stuck at a 0-level. Consequently, NorOut transitions at a later time to an OFF-state, as shown in FIG. 11g. In addition, the gridok signal does not transition to an OFF-state, as shown in FIG. 11j. The SSS reference signal stuck at a 0-level is thus detectable by the fault collectors.

It will be appreciated that although shown as three separate circuits, (1) the grid check circuit; (2) the fault collector module and (3) the state machine (or a controller) may be integrated into one circuit or two circuits, and may be placed on a layer(s) different from the metallization layers.

It will also be understood that the present invention contemplates verifying the integrity of a multi-layered device by periodically enabling/disabling the grid check circuits through the state machine (or controller). Accordingly, any tampering by an unauthorized user may be continuously monitored. For example, one integrity check may be performed as frequently as many times per second, or as little as every one hour. The integrity check may also be performed during boot-up (power-on) of the electronic device.

The grid check circuit may be utilized for almost any integrated circuit (IC) that utilizes multiple layers of metallization in its fabrication process. In terms of application, it may also be used in new high density packaging forms that rely on silicon substrate or fine lithography substrate materials. Power distribution may be assigned to specific planes within these packages and special on board sensor/test circuits may monitor the integrity, or health of the package by checking for any intrusion into the package itself, even before any attempt is made to attack the surface of the silicon chip. The advantage of utilizing the on-chip metallization planes reduces the need for added manufacturing and yield costs due to additional handling steps associated with post fabrication coatings or other protective mechanical means.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A protection circuit for integrity monitoring of an electronic device comprising
   a first grid check line interleaved between a first set of conductor lines, each distributing a first potential reference to the electronic device,
   a second grid check line interleaved between a second set of conductor lines, each distributing a second potential reference to the electronic device, and
   a grid check circuit coupled to the first and second grid check lines,
   wherein the first and second grid check lines are configured to provide first and second voltage references, respectively, to the grid check circuit for monitoring the integrity of the electronic device.

2. The protection circuit of claim 1, wherein
   the first and second potential references are VDD and VSS, respectively,
   the first and second voltage references are SSS and SDD, respectively, and
   the VDD potential reference is substantially similar to the SDD voltage reference, and the VSS potential reference is substantially similar to the SSS voltage reference.

3. The protection circuit of claim 1, wherein
   the electronic device is a multi-layered device,
   the first grid check line and the first set of conductor lines are disposed in one single layer of the multi-layered device, and
   the second grid check line and the second set of conductor lines are disposed in another single layer of the multi-layered device.

4. The protection circuit of claim 1, wherein
   the electronic device includes metallization layers,
   the first and second sets of conductor lines, respectively, are embedded in adjacent metallization layers for forming a power distribution grid in the electronic device, and
   the first and second grid check lines, respectively, are embedded in the same adjacent metallization layers for forming a voltage difference in the grid check circuit.

5. The protection circuit of claim 1, wherein
   the electronic device includes metallization layers,
   the first set of conductor lines are connected to each other and are longitudinally distributed in one metallization layer,
   the second set of conductors lines are connected to each other and are transversely distributed in another metallization layer,
   the first grid check line includes a plurality of first grid check lines connected to each other and longitudinally distributed in the one metallization layer, and the second grid check line includes a plurality of second grid check lines connected to each other and transversely distributed in the other metallization layer.

6. The protection circuit of claim 1, wherein
the first grid check line includes a plurality of first grid check lines connected to each other,
the second grid check line includes a plurality of second grid check lines connected to each other, and
the first and second grid check lines are orthogonally oriented to each other to form a mesh of lines.

7. The protection circuit of claim 1, wherein
the grid check circuit includes a least two separate grid check circuits disposed in different portions of the electronic device.

8. The protection circuit of claim 1, further including
a fault collector circuit, coupled to the grid check circuit, for providing to a user a status of the integrity of the electronic device.

9. The protection circuit of claim 1, further including
a state machine for placing the first and second voltage references on the first and second grid check lines, respectively, and
wherein the grid check circuit verifies that the first and second voltage references are present on the first and second grid check lines, respectively.

10. The protection circuit of claim 1, further including
a state machine for separately activating and turning-off the first and second voltage references on the first and second grid check lines, respectively, and wherein
the grid check circuit sequentially verifies that the first voltage reference is present on and then absent from the first grid check line, and
the grid check circuit sequentially verifies that the second voltage reference is present on and then absent from the second grid check line.

11. The protection circuit of claim 1, wherein
the electronic device includes an integrated circuit (IC) having multiple layers of metallization.

12. The protection circuit of claim 1, wherein
the electronic device is a high density package and includes a silicon substrate.

13. A mesh of conductors forming a grid in a multi-layered electronic device comprising
a first set of conductors disposed in one layer forming parallel lines in the one layer,
a second set of conductors disposed in another layer forming parallel lines in the other layer,
the first set of conductors configured to provide a first voltage reference, and the second set of conductors configured to provide a second voltage reference,
at least one grid check circuit, coupled to the first set of conductors and the second set of conductors, for monitoring presence and/or absence of at least one of the first or second voltage references.

14. The mesh of conductors of claim 13, wherein
the parallel lines in the one layer and the parallel lines in the other layer are substantially perpendicular to each other.

15. The mesh of conductors of claim 13, wherein
the multi-layered electronic device includes a first set of power lines and a second set of power lines for providing a potential difference to the electronic device, and
the first and second set of power lines are different from the first and second set of conductors.

16. The mesh of conductors of claim 15, wherein
the first set of power lines provides a positive voltage reference to the electronic device,
the first set of conductors provides a ground voltage reference, and
the first set of power lines is interleaved with the first set of conductors in the one layer.

17. The mesh of conductors of claim 16, wherein
the second set of power lines provides a ground voltage reference to the electronic device,
the second set of conductors provides a positive voltage reference, and
the second set of power lines is interleaved with the second set of conductors in the other layer.

18. The mesh of conductors of claim 13, further including
a controller, coupled to the at least one grid check circuit, for enabling and disabling the first and second voltage references,
wherein the at least one grid check circuit is configured to detect the enabling and/or the disabling of the first or second voltage references.

19. The mesh of conductors of claim 18, wherein
the controller is configured to periodically enable and disable the first and second voltage references, and
the at least one grid check circuit is configured to correspondingly periodically detect the enabling and/or disabling of the first or second voltage references.

20. A method for integrity monitoring of a multi-layered electronic device, comprising the steps of:
(a) distributing a first potential reference by way of one conducting layer of the electronic device;
(b) distributing a second potential reference by way of another conducting layer of the electronic device;
(c) distributing a first voltage reference, which is different from the first potential reference in the one conducting layer;
(d) distributing a second voltage reference, which is different from the second potential reference in the other conducting layer; and
(e) periodically monitoring the distribution of the first and second voltage references to determine the integrity of the multi-layered electronic device.

* * * * *